United States Patent [19]
Zingg et al.

[11] Patent Number: 5,153,478
[45] Date of Patent: Oct. 6, 1992

[54] RESONATOR HAVING A BAR DESIGNED TO VIBRATE IN ONE EXTENSION MODE

[75] Inventors: Walter Zingg, La Neuveville; Bruno Studer, Riedholz, both of Switzerland

[73] Assignee: ETA SA Fabriques d'Ebauches, Switzerland

[21] Appl. No.: 695,910

[22] Filed: May 6, 1991

[30] Foreign Application Priority Data

May 10, 1990 [FR] France ................. 90 05971

[51] Int. Cl.⁵ .............................. H01L 41/08
[52] U.S. Cl. ................... 310/367; 310/346; 310/368
[58] Field of Search ............ 310/346, 367, 368

[56] References Cited

U.S. PATENT DOCUMENTS

| | | | |
|---|---|---|---|
| 1,954,238 | 4/1934 | Cady | 310/349 |
| 3,906,260 | 9/1975 | Oguchi | 310/346 |
| 4,065,684 | 12/1977 | Hermann et al. | 310/351 |
| 4,608,510 | 8/1986 | Dinger et al. | 310/361 |
| 4,926,086 | 5/1990 | Bourgeois et al. | 310/367 |

FOREIGN PATENT DOCUMENTS

| | | |
|---|---|---|
| 0056783 | 7/1982 | European Pat. Off. |
| 2520547 | 11/1975 | Fed. Rep. of Germany ...... 310/367 |
| 2534683 | 2/1976 | Fed. Rep. of Germany . |
| 2702106 | 8/1977 | Fed. Rep. of Germany ...... 310/361 |
| 1560537 | 2/1980 | United Kingdom . |

OTHER PUBLICATIONS

French Search Report in related French Application No. 90 05971.

*Primary Examiner*—Mark O. Budd
*Assistant Examiner*—Thomas M. Dougherty
*Attorney, Agent, or Firm*—Pollock, Vande Sande & Priddy

[57] ABSTRACT

A resonator has a parallelepipedal bar of a piezoelectric material designed to vibrate in an extension mode, and suspension means of said bar which form a single, integral part with the latter and which are only connected to one of its lateral faces. This arrangement makes it possible to reduce the number of parasitic vibration modes which could couple to the main mode as well as coupling between these modes, and hence variations as a function of the temperature in the characteristics of the resonator, notably in its quality factor.

6 Claims, 1 Drawing Sheet

RESONATOR HAVING A BAR DESIGNED TO VIBRATE IN ONE EXTENSION MODE

BACKGROUND OF THE INVENTION

It is an object of the present invention to provide a resonator comprising a parallelepipedal bar of a piezoelectric material adapted to vibrate in an extension mode and suspension means for said bar forming a single piece integral with said bar and adapted to connect said bar to a base.

Resonators of this type are in particular described in patent GB-B-1,560,537 and U.S. Pat. No. 4,608,510 and will not be described again in detail here.

It will simply be noted that all these known resonators have bar suspension means comprising two arms perpendicular to the longitudinal axis of the bar that are symmetrical to one another in relation to this axis, each having one extremity connected to one of the lateral faces of this bar, substantially at the mid-point of its length.

These suspension means moreover have supports parallel to the longitudinal axis of the bar, also symmetrical in relation to this axis, and connected to the other extremity of the above-mentioned arms. Together with additional parts, these supports form a frame completely surrounding the bar, as in FIG. 1 of patent GB-B-1,560,537 already mentioned, or only half thereof, as in FIG. 5 of the same patent or in FIG. 4 of U.S. Pat. No. 4,608,510 also already mentioned.

The electrical connection terminals of the resonator, which also serve to fix it mechanically to a base, are disposed on this frame and conductive tracks connecting these terminals to the vibration excitation electrode of the bar are also disposed, in part, on this frame and extend onto the above mentioned bars.

A resonator of this type generally displays good characteristics, notably a high quality factor. What is more, it is also relatively easy to mass produce, notably using conventional processes involving photolithographic and chemical etching techniques, especially when it resembles the resonator described in U.S. Pat. No. 4,608,510. It consequently has a relatively low cost price.

Nevertheless, a resonator of this type, in common with all resonators regardless of their type, is a very complex vibrating system.

Each of its components, and in particular each of the elements of the suspension means of its bar, can in fact, be caused to vibrate in a large number of different modes which, with the exception of the main extension mode in which the vibration of the bar is excited, are all parasitic modes.

These parasitic modes have frequencies and amplitudes which it is virtually impossible to predict in advance because they depend on the precise dimensions of various components of the resonator, notably on its bar suspension means. However, there are always small differences in these dimensions from one resonator to another, even within one production batch. It has also been found that these frequencies and these amplitudes depend quite considerably on the way in which the resonator is fixed to the base and on the amplitude of the excitation signal applied thereto by the oscillator circuit to which it is connected. Moreover, these frequencies and these amplitudes vary as a function of the temperature in a different manner from one mode to another.

When the frequency of one of these parasitic modes is close to the frequency of the main vibration mode of the bar or of one of its harmonics, this parasitic mode can be coupled to this main mode and, if its amplitude is sufficiently large, it can absorb a not negligible part of the energy of the main mode. Coupling of this kind can modify the frequency of vibration of the resonator and/or impair its characteristics, notably its quality factor, it even being possible for this deterioration to lead to cessation of the oscillator circuit of which this resonator forms part.

The risk of coupling of this type is particularly great in the known resonators described above. In fact, the variations in the length of the bar whilst this vibrates in its main vibration mode are inevitably accompanied by variations in its width. In other words, the bar vibrates simultaneously in its main extension mode and in a secondary transverse mode, these two modes being perfectly coupled and having exactly the same frequency.

Since the bar suspension means are solidly connected to the lateral faces thereof which are displaced by this transverse vibration, this latter can clearly be very easily coupled with one or other of the parasitic vibrations which can originate in these suspension means, notably in the supports parallel to the length of the bar.

It emerges from the foregoing that all these known resonators have characteristics, and variations thereof as a function of temperature, which are not entirely foreseeable. All these resonators therefore have to be tested after manufacture throughout the entire temperature range within which they are to operate because, even within one and the same production batch, some of them may display, at certain temperatures, a variation in their frequency of vibration and/or a reduction in their quality factor in excess of permissible tolerances. These latter resonators naturally have to be scrapped. The cost of these tests and the reduction in output due to this scrapping of defective resonators naturally increases the cost price of these resonators.

Further, before commencing mass production of a new resonator, even if this differs only slightly from an already produced resonator, numerous tests have to be carried out on this new resonator in order to check its characteristics. These tests frequently show that these characteristics are not exactly what is required. It is then necessary to change the shape and/or the dimensions of one or other of the components of this new resonator and then to repeat the tests to determine whether these modifications have had the desired effect. This process sometimes has to be repeated several times.

These tests and modifications are, of course, lengthy and costly and further increase the cost price of these known resonators.

U.S. Pat. No. 3,906,260 describes a resonator comprising a bar designed to vibrate in torsion about its longitudinal axis and a single suspension arm from this bar which forms a single, integral part with this latter. One of the extremities of this arm is connected to one of the faces of the bar, at the middle of the length of this bar, and the other extremity of this arm, which carries the electrical contact terminals of the resonator, is fixed by means of welding directly onto connection wires which cross a base forming part of the resonator housing.

Experience has shown that a resonator comprising a bar designed to vibrate in extension and a single bar resembling that of the resonator described in this patent US-A-3,906,260 presents substantially the same disadvantages as the previously mentioned resonators. This is due to the fact that the welding of the contact terminals of the resonator on the wires crossing the base cannot present precisely the same characteristics from one resonator to another and that this base itself can be the seat of parasitic vibrations having frequencies which cannot be predicted any more than can their variation as a function of temperature. What is more, the frequencies of these parasitic vibrations depend on the way in which the encapsulated resonator is mounted in its ultimate location.

OBJECTS OF THE INVENTION

One object of the instant invention is to provide a resonator of the type defined hereinabove which does not present the disadvantages of known resonators; that is a resonator, the characteristics of which and their variation as a function of temperature can be more reliably predicted and are more constant from one unit to another, and more independent in the way in which it is mounted on the base and in the amplitude of the excitation signal applied thereto. These properties simplify the checks which it has to undergo after its manufacture and/or those which have to be carried out before production begins after modification, manufacture yield is increased and the cost price is consequently reduced.

This objective is achieved by the resonator of the invention.

Other characteristics and advantages of the resonator of the invention will emerge from the following description with reference to the appended drawing.

BRIEF DESCRIPTION OF THE DRAWINGS

In these drawings, FIGS. 1 to 4 each show, by way of example only, an embodiment of the resonator of the invention in a diagrammatic plan view.

In all these figures, the resonators and their similar components are designated by the same reference numerals.

DETAILED DESCRIPTION OF THE INVENTION

Figure 1:
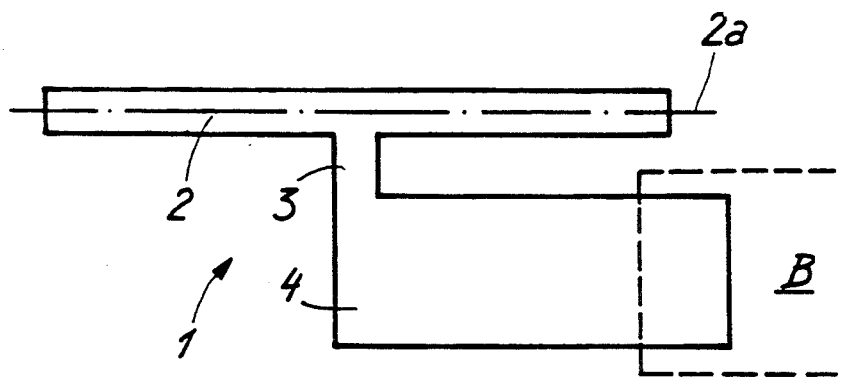

The resonator shown by way of non limiting example in FIG. 1 with reference numeral 1 comprises an elongated parallelepipedal bar 2 designed to vibrate in one extension mode, which is also sometimes termed an extension-contraction mode.

The dimension of this bar 2, notably its length, are determined, as in known resonators, as a function of the frequency at which it must vibrate and the technological limitations imposed by the production process selected for the resonator 1.

The bar suspension means comprise a single arm 3, a first extremity of which is connected to one of the lateral faces of the bar 2 substantially at the middle of its length and perpendicular to its longitudinal axis 2a. The dimensions of this arm 3 are not critical and are essentially determined by the above-mentioned technological restrictions.

The bar suspension means also comprise a support 4 substantially rectangular in shape in this example, the length of which is parallel to the longitudinal axis 2a of the bar 2.

The arm 3 is connected to one of the extremities of the support 4, perpendicular to one of the longer sides thereof.

The other extremity of the support 4 is designed to be fixed, for example by bonding, to a base forming part of a protective housing for the resonator 1. This base has only been very diagrammatically shown with reference B in the form of a broken line, and the housing has not been shown at all since these elements are well known to persons skilled in the art, and their exact nature has no direct relevance to the instant invention.

The bar 2, the arm 3 and the support 4 constitute one and the same piece which has been cut in a wafer of piezoelectric material, for example of quartz, by any of the machining processes used for these materials which are well known to persons skilled in the art and will not be described herein.

In a conventional manner for a bar adapted to vibrate in an extension mode, the longitudinal axis 2a of the bar 2 is substantially parallel to the mechanical axis Y of the piezoelectric material of which the resonator 1 is made.

The width of the bar 2, i.e. its dimension perpendicular to its longitudinal axis 2a and parallel to the plane of FIG. 1 can, depending on the individual case, be substantially parallel to the optical axis Z or the electrical axis X of this piezoelectric material.

This latter orientation is generally preferred since it is the one which makes it possible to manufacture the resonator 1 using the process that is most suitable for mass production, i.e. the conventional process comprising depositing a mask on a wafer of the piezoelectric material using a photolithographic method and chemically etching this wafer at places where it is not protected by this mask.

In all these cases and in equally conventional manner for a bar designed to vibrate in one extension mode, the electrodes exciting the vibration of the bar 2 are disposed on the faces thereof which are substantially perpendicular to the electrical axis X of the piezoelectric material.

The resonator 1 also comprises, in conventional manner, conductive tracks disposed on the arm 3 and on the support 4 and connecting the electrodes exciting the vibration of the bar 2 to the connection terminals situated in the area of the support 4 which is designed to be fixed to the above-mentioned base B.

These electrodes, tracks and terminals have not been shown so as not to overload the drawing unnecessarily and because their shape and their arrangement can be easily determined, from one case to another, by a person skilled in the art.

It will easily be seen that, in the resonator 1 of the invention described above, the number of parasitic modes is substantially lower than in the known resonators described in the above-mentioned patents GB-B-1,560,537 and U.S. Pat. No. 4,608,510, because its bar suspension means only comprise a single arm 3 and a single support 4, whereas the bar suspension means of these known resonators comprise two arms and two supports which may each be the seat of vibrations in parasitic modes having different frequencies.

Moreover, since these bar support means of the resonator 1 of the invention are only fixed to one of the lateral faces of bar 2, the width of the support 4, that is to say its dimension in the direction perpendicular to that of the longitudinal axis 2a of the bar 2, can be substantially greater, for a same vibrating bar and without increasing the total width of the resonator, than that of each of the supports located on either side of the vibrating bar in known resonators.

Since the rigidity of the support 4 and hence the frequencies of the parasitic vibration modes of which it is the seat, depend directly on its width, these frequencies may be substantially higher in the resonator of the invention than in known resonators.

In practice, and still for a same total resonator width, it may be seen that the support 4 of the resonator of the invention may have a width as wide as the sum of the widths of the two supports of known resonators, increased by the width of one of the spaces which, in these known resonators, separate the vibrating bar from these supports.

As in these known resonators, each of the supports of the bar and each of the spaces separating these supports from this bar is generally at least twice as wide as the bar, the support 4 of the resonator of the instant invention can thus have a width more that six times the width of the bar 2.

Theoretical considerations confirmed by practical tests have, however, shown that, if the support 4 is only twice the width of the bar 2, the reduction in the number of parasitic modes mentioned hereinabove already results in the variation in characteristics from one unit to another of the resonator of the invention being substantially less that in the case of known resonators, which increases the manufacture yield of this resonator of the invention and thus reduces its cost price.

What is more, these considerations and these tests have shown that if the length of the support 4 is greater than, or equal to, three times the width of the bar 2, the frequencies of the parasitic modes of this support 4 are already sufficiently high that there is no risk of these parasitic modes impairing the working of the resonator 1, this applying throughout the range of temperatures at which this is intended to operate.

Moreover, because the bar support means of the resonator 1 of the invention are only fixed to one of the lateral faces of the bar 2, the other lateral face of this bar 2 is free to move if necessary. The transverse vibration of this bar 2, which must be coupled to its vibration in its main extension mode, as has already been reiterated above, is consequently unable to couple itself directly to a parasitic vibration mode of the bar suspension means.

It will be seen that, in the resonator 1 of the invention, the number of parasitic modes which risk causing, at certain temperatures, deterioration in the characteristics of this resonator, is greatly reduced since the total number of these parasitic modes is smaller than in known resonators and since the frequency of the majority of these parasitic modes can be made sufficiently high so that they do not affect the main bar vibration mode, whatever the temperature may be. What is more, the coupling between these parasitic modes and the main mode is much weaker than in these known resonators.

It follows that, in relation to these known resonators, the characteristics of the resonators of the invention and the variation of these characteristics as a function of temperature are substantially more predictable and more constant from one unit to another. These characteristics and their variation are, moreover, much less dependent on the shape and dimensions of the vibrating bar suspension means, as well as of the manner in which these resonators are fixed to their base and of the amplitude of the excitation signal applied thereto.

Checks of the characteristics of these resonators and of the variation of these characteristics as a function of temperature which have to be made after manufacture, can therefore be more straightforward than in the case of known resonators. What is more, fewer resonators need to be rejected as a result of these tests and their manufacture yield therefore exceeds that of known resonators. In addition, the preliminary tests needed before beginning mass production of a new resonator can be simpler than in the case of known resonators and it is less often necessary to modify this new resonator as a result of these preliminary tests. The simplification of these tests and this increase in manufacture yield naturally reduce the cost price of these resonators of the invention as compared to that of these known resonators.

It may also be seen that, in the resonator of the invention, the presence of the support 4 between the arm 3 and the base B prevents any coupling between the main bar vibrating mode and the vibration modes of this base B.

This resonator of the invention consequently also has the advantages listed above in connection with a resonator made in the manner suggested in patent U.S. Pat. No. 3,906,260 already mentioned, i.e. a resonator in which the bar suspensions means would not comprise any element resembling the support 4, the arm 3 being fixed directly to the base B.

Figure 2:
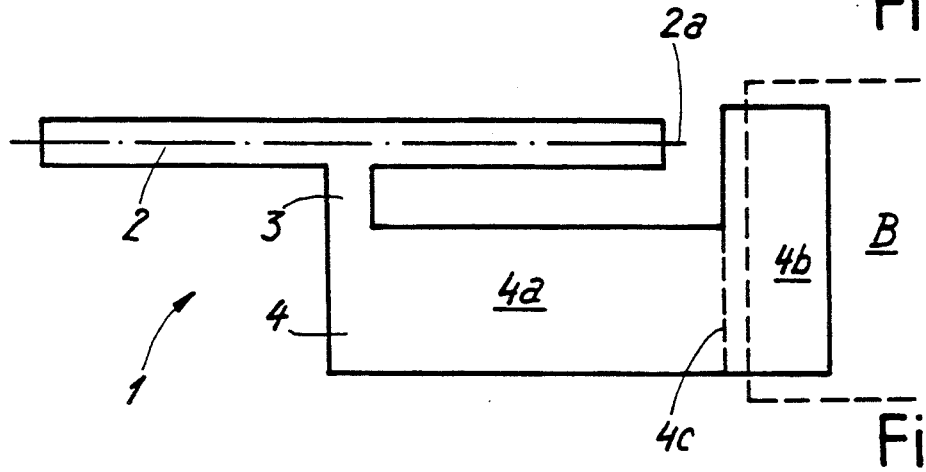

In the embodiment of the resonator of the invention shown in FIG. 2, the support 4 which, together with the arm 3, constitutes the bar suspension means, comprises two parts bearing reference numerals 4a and 4b respectively.

The part 4a is substantially similar to support 4 in FIG. 1 and, in common with the latter, it is connected by one of its extremities to the arm 3.

The other extremity of this part 4a is connected to the part 4b, which takes the form of a rectangle, one of the small sides of which is in the continuation of one of the sides of the part 4a and the large sides of which are perpendicular to the longitudinal axis 2a of the bar 2 and extend beyond this latter. The support 4 is thus substantially L-shaped.

The advantage of this embodiment in relation to that of FIG. 1 is that it provides more space in which to place the connection terminals of the resonator 1, without increasing the overall width of the housing in which this is mounted.

It should be noted that the broken line 4c separating the parts 4a and 4b in FIG. 2 has only been added to simplify the description, these parts 4a and 4b obviously only forming a single integral piece with the other components of the resonator 1.

Figure 3:
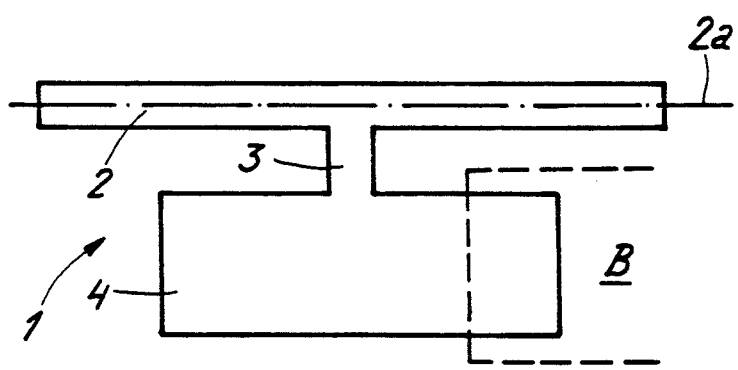

In the embodiment of the resonator of the invention shown in FIG. 3, the support 4 is in the shape of a rectangle, the long sides of which are parallel to the longitudinal axis 2a of the bar 2, as in the case in FIG. 1. However, in the resonator of FIG. 3, the arm 3 is connected to the support 4 at the middle of one of its long sides, this support 4 thus extending on either side of this arm 3.

In this embodiment, the connection terminals of the resonator 1 can be disposed along the long side of the support 4 which is opposite the arm 3, thereby making it possible to reduce the length of the housing in which this resonator is mounted.

Various other embodiments of the resonator of the invention may be realized by changing the shape, the dimensions and/or the reciprocal arrangement of the arm and of the support composing part of the vibrating bar suspensions means of this resonator.

These other embodiments will not be described herein because their number is virtually limitless and the person skilled in the art will have no difficulty in making them on the basis of those shown in FIG. 1 to 3.

It goes without saying that all these embodiments of the resonator of the invention have the same advantages over known resonators as has the resonator of FIG. 1.

In the above described embodiments of the resonator of the invention, the two lateral faces of the bar 2 are not identical because only one of these is connected to the suspension means of this bar 2. As a result, the main extension mode of this bar 2 may be transformed into a combined mode of extension and bending in a plane parallel to the plane of FIGS. 1 to 3.

If this bending of the bar 2 is of sufficient amplitude, it may be transmitted to the support 4 by the arm 3 and may possible couple with one or other of the parasitic vibration modes of this support 4, this coupling then causing deterioration in the characteristics of the resonator 1.

Figure 4:
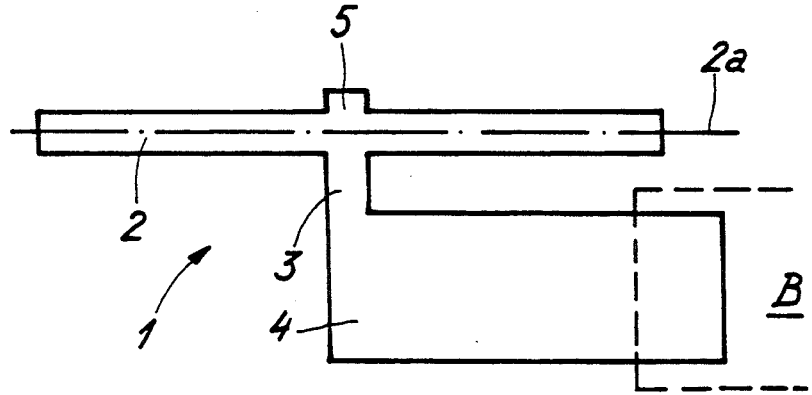

FIG. 4 shows an embodiment of the resonator of the invention where the risk of this disadvantage is nonexistent or less than in the case of the above described embodiments.

The resonator of FIG. 4, also designated 1, comprises a bar 2, an arm 3 and a support 4 similar to the elements having the same reference numerals as in FIG. 1. It also has a protrusion 5 disposed on the lateral face of the bar 2 which is opposite that to which the arm 3 is connected.

This protrusion 5 is located at the middle of the length of the bar 2, that is opposite the arm 3. It is obviously made at the same time as the other elements of the resonator 1 and its thickness is therefore equal to that of these latter with which it is integral.

In the example shown in FIG. 4, the protrusion 5 is in the shape of a rectangle, the longer sides of which are parallel to the longitudinal axis 2a of the bar 2 and their length is equal to the width of the arm 3 and the length of smaller sides of which, perpendicular to this axis, is equal to about half the width of the bar 2.

Theoretical consideration confirmed by practical tests have, however, shown that the dimensions of this protrusion 5 are not very critical and that their relationships to the width of the arm 3 and, respectively, the width of the bar 2 may differ substantially from those mentioned hereinabove.

Indeed, these consideration and these tests have shown that the simple presence of a protrusion such as the protrusion 5 at the middle of the length of the bar 2 prevents the appearance of the parasitic mode of bending vibration of this latter, mentioned hereinabove, or at least greatly reduces the amplitude of this vibration, thanks to the fact that this protrusion re-establishes some form of symmetry between the two lateral faces of this bar 2.

The same also applies if the shape of this protrusion differs from that of the protrusion 5, that is if it is, for example, triangular, trapezoid or semicircular.

It is also obvious that a protrusion of this type may be provided, with the same advantages, in the embodiments of the resonator of the invention described with reference to FIGS. 2 and 3, or in any other above mentioned embodiment of this resonator.

What is claimed is:

1. A resonator comprising a parallelepipedal bar of a piezoelectric material designed to vibrate in an extension mode and suspension means for suspending said bar from a base, said suspension means forming a single part integral with said bar and comprising:

a single arm having a first extremity connected to one of the lateral faces of said bar substantially at the middle of the length of said bar; and, a single support connected to a second extremity of said arm and adapted to be fixed to said base, said support comprising at least a part which is substantially rectangular in shape, and said rectangular part having two sides parallel to the longitudinal axis of said bar and a width equal to, or greater than, twice the width of said bar.

2. A resonator according to claim 1 which further comprises a protrusion also forming a single part integral with said bar and disposed on the other lateral face of said bar substantially at the middle of the length of said bar.

3. A resonator according to claim 1 wherein said arm is connected to said support at the extremity of one of said sides parallel to the longitudinal axis of said bar.

4. A resonator according to claim 1, wherein said arm is connected to said support substantially at the middle of one of said sides parallel to the longitudinal axis of said bar.

5. A resonator according to claim 1 wherein said rectangular part is a first part and said support further comprises a second part which also is substantially rectangular in shape and has two sides parallel to the longitudinal axis of said bar, said second part being connected to one of the extremities of said first part in such a way that said support is generally L-shaped, and said arm being connected to the other extremity of said first part.

6. A resonator according to claim 1, wherein the width of said rectangular part is equal to, or greater than, three times said width of said bar.

* * * * *